US008590797B2

(12) United States Patent
Kato et al.

(10) Patent No.: US 8,590,797 B2
(45) Date of Patent: Nov. 26, 2013

(54) WIRELESS IC DEVICE

(75) Inventors: Noboru Kato, Moriyama (JP); Nobuo Ikemoto, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/585,866

(22) Filed: Aug. 15, 2012

(65) Prior Publication Data
US 2012/0305657 A1    Dec. 6, 2012

Related U.S. Application Data

(63) Continuation of application No. 12/903,242, filed on Oct. 13, 2010, which is a continuation of application No. PCT/JP2009/058682, filed on May 8, 2009.

(30) Foreign Application Priority Data

May 21, 2008 (JP) .................................. 2008-133335
Sep. 18, 2008 (JP) .................................. 2008-239826

(51) Int. Cl.
*G06K 19/06* (2006.01)

(52) U.S. Cl.
USPC ........................................................ 235/492

(58) Field of Classification Search
USPC ........................................................ 235/492
See application file for complete search history.

(56) References Cited

U.S. PATENT DOCUMENTS

| | | |
|---|---|---|
| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |

(Continued)

FOREIGN PATENT DOCUMENTS

| | | |
|---|---|---|
| CA | 2 279 176 A1 | 7/1998 |
| DE | 10 2006 057 369 A1 | 6/2008 |

(Continued)

OTHER PUBLICATIONS

English translation of NL9100176, published on Mar. 2, 1992.

(Continued)

*Primary Examiner* — Michael G Lee
*Assistant Examiner* — David Tardif
(74) *Attorney, Agent, or Firm* — Keating & Bennett, LLP

(57) ABSTRACT

A wireless IC device includes a wireless IC chip arranged to process a radio signal, a power-supply circuit board that is connected to the wireless IC chip and that includes a power supply circuit including at least one coil pattern, and a radiation plate arranged to radiate a transmission signal supplied from the power-supply circuit board and/or receiving a reception signal to supply the reception signal to the power-supply circuit board. The radiation plate includes an opening provided in a portion thereof and a slit connected to the opening. When viewed in plan from the direction of the winding axis of the coil pattern, the opening in the radiation plate overlaps with an inner area of the coil pattern and the area of the inner area is approximately the same as that of opening.

14 Claims, 11 Drawing Sheets

(56) References Cited

U.S. PATENT DOCUMENTS

| | | |
|---|---|---|
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,311 A | 8/2000 | Lastinger |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,243,045 B1 | 6/2001 | Ishibashi |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,452,563 B1 | 9/2002 | Porte |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,956,481 B1 | 10/2005 | Cole |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 2001/0011012 A1 | 8/2001 | Hino et al. |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0001031 A1* | 1/2005 | Akiho et al. ............... 235/451 |
| 2005/0007296 A1* | 1/2005 | Endo et al. ............... 343/895 |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0032926 A1 | 2/2006 | Baba et al. |
| 2006/0044192 A1 | 3/2006 | Egbert |
| 2006/0044769 A1 | 3/2006 | Forster et al. |
| 2006/0055531 A1 | 3/2006 | Cook et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0214801 A1 | 9/2006 | Murofushi et al. |
| 2006/0220871 A1 | 10/2006 | Baba et al. |
| 2006/0244568 A1 | 11/2006 | Tong et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0132591 A1 | 6/2007 | Khatri |
| 2007/0164414 A1 | 7/2007 | Dokai et al. |
| 2007/0200782 A1 | 8/2007 | Hayama et al. |
| 2007/0229276 A1 | 10/2007 | Yamagajo et al. |
| 2007/0247387 A1 | 10/2007 | Kubo et al. |
| 2007/0252700 A1 | 11/2007 | Ishihara et al. |
| 2007/0252703 A1* | 11/2007 | Kato et al. ............... 340/572.8 |
| 2007/0252763 A1 | 11/2007 | Martin |
| 2007/0285335 A1 | 12/2007 | Bungo et al. |
| 2007/0290928 A1 | 12/2007 | Chang et al. |
| 2008/0024156 A1 | 1/2008 | Arai et al. |
| 2008/0068132 A1 | 3/2008 | Kayanakis et al. |
| 2008/0070003 A1 | 3/2008 | Nakatani et al. |
| 2008/0087990 A1 | 4/2008 | Kato et al. |
| 2008/0143630 A1 | 6/2008 | Kato et al. |
| 2008/0169905 A1 | 7/2008 | Slatter |
| 2008/0184281 A1 | 7/2008 | Ashizaki et al. |
| 2008/0272885 A1 | 11/2008 | Atherton |
| 2009/0002130 A1 | 1/2009 | Kato |
| 2009/0009007 A1 | 1/2009 | Kato et al. |
| 2009/0021352 A1 | 1/2009 | Kataya et al. |
| 2009/0021446 A1* | 1/2009 | Kataya et al. ............... 343/860 |
| 2009/0051606 A1* | 2/2009 | Ochi et al. ............... 343/702 |
| 2009/0065594 A1 | 3/2009 | Kato et al. |
| 2009/0109102 A1 | 4/2009 | Dokai et al. |
| 2009/0160719 A1 | 6/2009 | Kato et al. |
| 2009/0201116 A1* | 8/2009 | Orihara ............... 336/200 |
| 2009/0224061 A1 | 9/2009 | Kato et al. |
| 2009/0231106 A1 | 9/2009 | Okamura |
| 2009/0262041 A1 | 10/2009 | Ikemoto et al. |
| 2009/0266900 A1 | 10/2009 | Ikemoto et al. |
| 2009/0278687 A1 | 11/2009 | Kato |
| 2009/0321527 A1 | 12/2009 | Kato et al. |
| 2010/0103058 A1 | 4/2010 | Kato et al. |
| 2010/0182210 A1 | 7/2010 | Ryou et al. |
| 2010/0308118 A1 | 12/2010 | Kataya et al. |
| 2011/0031320 A1 | 2/2011 | Kato et al. |
| 2011/0063184 A1 | 3/2011 | Furumura et al. |

FOREIGN PATENT DOCUMENTS

| | | |
|---|---|---|
| EP | 0 694 874 A2 | 1/1996 |
| EP | 0 848 448 A2 | 6/1998 |
| EP | 0 948 083 A2 | 10/1999 |
| EP | 0 977 145 A2 | 2/2000 |
| EP | 1 010 543 A1 | 6/2000 |
| EP | 1 085 480 A1 | 3/2001 |
| EP | 1 160 915 A2 | 12/2001 |
| EP | 1 170 795 A2 | 1/2002 |
| EP | 1 193 793 A2 | 4/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 547 753 A1 | 6/2005 |
| EP | 1 548 872 A1 | 6/2005 |

(56) References Cited

FOREIGN PATENT DOCUMENTS

| | | |
|---|---|---|
| EP | 1 626 364 A2 | 2/2006 |
| EP | 1 701 296 A1 | 9/2006 |
| EP | 1 703 589 A1 | 9/2006 |
| EP | 1 742 296 A1 | 1/2007 |
| EP | 1 744 398 A1 | 1/2007 |
| EP | 1 840 802 A1 | 10/2007 |
| EP | 1 841 005 A1 | 10/2007 |
| EP | 1 865 574 A1 | 12/2007 |
| EP | 1 887 652 A1 | 2/2008 |
| EP | 1 976 056 A1 | 10/2008 |
| EP | 1 988 491 A1 | 11/2008 |
| EP | 1 988 601 A1 | 11/2008 |
| EP | 1 993 170 A1 | 11/2008 |
| EP | 2 009 738 A1 | 12/2008 |
| EP | 2 012 258 A1 | 1/2009 |
| EP | 2 096 709 A1 | 9/2009 |
| EP | 2 148 449 A1 | 1/2010 |
| EP | 2 166 617 A1 | 3/2010 |
| EP | 2 251 934 A1 | 11/2010 |
| EP | 2 256 861 A1 | 12/2010 |
| EP | 2 330 684 A1 | 6/2011 |
| GB | 2 305 075 A | 3/1997 |
| GB | 2461443 A | 1/2010 |
| JP | 50-143451 A | 11/1975 |
| JP | 61-284102 A | 12/1986 |
| JP | 62-127140 U | 8/1987 |
| JP | 01-212035 A | 8/1989 |
| JP | 02-164105 A | 6/1990 |
| JP | 02-256208 A | 10/1990 |
| JP | 3-171385 A | 7/1991 |
| JP | 03-503467 A | 8/1991 |
| JP | 03-262313 A | 11/1991 |
| JP | 04-150011 A | 5/1992 |
| JP | 04-167500 A | 6/1992 |
| JP | 04-096814 U | 8/1992 |
| JP | 04-101168 U | 9/1992 |
| JP | 04-134807 U | 12/1992 |
| JP | 05-226926 A | 9/1993 |
| JP | 05-327331 A | 12/1993 |
| JP | 6-53733 A | 2/1994 |
| JP | 06-077729 A | 3/1994 |
| JP | 06-029215 U | 4/1994 |
| JP | 06-177635 A | 6/1994 |
| JP | 6-260949 A | 9/1994 |
| JP | 07-183836 A | 7/1995 |
| JP | 08-055725 A | 2/1996 |
| JP | 08-056113 A | 2/1996 |
| JP | 8-87580 A | 4/1996 |
| JP | 08-88586 A | 4/1996 |
| JP | 08-088586 A | 4/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 9-93029 A | 4/1997 |
| JP | 09-093029 A | 4/1997 |
| JP | 09-245381 A | 9/1997 |
| JP | 09-252217 A | 9/1997 |
| JP | 09-270623 A | 10/1997 |
| JP | 09-284038 A | 10/1997 |
| JP | 9-512367 A | 12/1997 |
| JP | 10-69533 A | 3/1998 |
| JP | 10-069533 A | 3/1998 |
| JP | 10-505466 A | 5/1998 |
| JP | 10-171954 A | 6/1998 |
| JP | 10-173427 A | 6/1998 |
| JP | 10-193849 A | 7/1998 |
| JP | 10-193851 A | 7/1998 |
| JP | 10-242742 A | 9/1998 |
| JP | 10-293828 A | 11/1998 |
| JP | 10-334203 A | 12/1998 |
| JP | 11-025244 A | 1/1999 |
| JP | 11-039441 A | 2/1999 |
| JP | 11-075329 A | 3/1999 |
| JP | 11-085937 A | 3/1999 |
| JP | 11-88241 A | 3/1999 |
| JP | 11-102424 A | 4/1999 |
| JP | 11-103209 A | 4/1999 |
| JP | 11-149536 A | 6/1999 |
| JP | 11-149537 A | 6/1999 |
| JP | 11-149538 A | 6/1999 |
| JP | 11-175678 A | 7/1999 |
| JP | 11-219420 A | 8/1999 |
| JP | 11-220319 A | 8/1999 |
| JP | 11-282993 A | 10/1999 |
| JP | 11-328352 A | 11/1999 |
| JP | 11-331014 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-137779 A | 5/2000 |
| JP | 2000-137785 A | 5/2000 |
| JP | 2000-148948 A | 5/2000 |
| JP | 2000-172812 A | 6/2000 |
| JP | 2000-209013 A | 7/2000 |
| JP | 2000-222540 A | 8/2000 |
| JP | 2000-510271 A | 8/2000 |
| JP | 2000-242754 A | 9/2000 |
| JP | 2000-243797 A | 9/2000 |
| JP | 2000-251049 A | 9/2000 |
| JP | 2000-261230 A | 9/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2000-349680 A | 12/2000 |
| JP | 2001-10264 A | 1/2001 |
| JP | 2001-028036 A | 1/2001 |
| JP | 2001-043340 A | 2/2001 |
| JP | 3075400 U | 2/2001 |
| JP | 2001-66990 A | 3/2001 |
| JP | 2001-76111 A | 3/2001 |
| JP | 2001-084463 A | 3/2001 |
| JP | 2001-101369 A | 4/2001 |
| JP | 2001-505682 A | 4/2001 |
| JP | 2001-168628 A | 6/2001 |
| JP | 2001-188890 A | 7/2001 |
| JP | 2001-209767 A | 8/2001 |
| JP | 2001-240046 A | 9/2001 |
| JP | 2001-240217 A | 9/2001 |
| JP | 2001-256457 A | 9/2001 |
| JP | 2001-257292 A | 9/2001 |
| JP | 2001-514777 A | 9/2001 |
| JP | 2001-291181 A | 10/2001 |
| JP | 2001-319380 A | 11/2001 |
| JP | 2001-331976 A | 11/2001 |
| JP | 2001-332923 A | 11/2001 |
| JP | 2001-339226 A | 12/2001 |
| JP | 2001-344574 A | 12/2001 |
| JP | 2001-351083 A | 12/2001 |
| JP | 2001-351084 A | 12/2001 |
| JP | 2001-352176 A | 12/2001 |
| JP | 2001-358527 A | 12/2001 |
| JP | 2002-024776 A | 1/2002 |
| JP | 2002-026513 A | 1/2002 |
| JP | 2002-32731 A | 1/2002 |
| JP | 2002-042076 A | 2/2002 |
| JP | 2002-042083 A | 2/2002 |
| JP | 2002-063557 A | 2/2002 |
| JP | 2002-505645 A | 2/2002 |
| JP | 2002-076750 A | 3/2002 |
| JP | 2002-76750 A | 3/2002 |
| JP | 2002-111363 A | 4/2002 |

(56) References Cited

FOREIGN PATENT DOCUMENTS

| | | |
|---|---|---|
| JP | 2002-150245 A | 5/2002 |
| JP | 2002-157564 A | 5/2002 |
| JP | 2002-158529 A | 5/2002 |
| JP | 2002-175508 A | 6/2002 |
| JP | 2002-183676 A | 6/2002 |
| JP | 2002-183690 A | 6/2002 |
| JP | 2002-185358 A | 6/2002 |
| JP | 2002-204117 A | 7/2002 |
| JP | 2002-521757 A | 7/2002 |
| JP | 2002-522849 A | 7/2002 |
| JP | 2002-230128 A | 8/2002 |
| JP | 2002-232221 A | 8/2002 |
| JP | 2002-246828 A | 8/2002 |
| JP | 2002-252117 A | 9/2002 |
| JP | 2002-259934 A | 9/2002 |
| JP | 2002-280821 A | 9/2002 |
| JP | 2002-298109 A | 10/2002 |
| JP | 2002-308437 A | 10/2002 |
| JP | 2002-319008 A | 10/2002 |
| JP | 2002-319009 A | 10/2002 |
| JP | 2002-319812 A | 10/2002 |
| JP | 2002-362613 A | 12/2002 |
| JP | 2002-366917 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-022912 A | 1/2003 |
| JP | 2003-026177 A | 1/2003 |
| JP | 2003-030612 A | 1/2003 |
| JP | 2003-037861 A | 2/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-76963 A | 3/2003 |
| JP | 2003-78333 A | 3/2003 |
| JP | 2003-078336 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099184 A | 4/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |
| JP | 2003-158414 A | 5/2003 |
| JP | 2003-168760 A | 6/2003 |
| JP | 2003-179565 A | 6/2003 |
| JP | 2003-187207 A | 7/2003 |
| JP | 2003-187211 A | 7/2003 |
| JP | 2003-188338 A | 7/2003 |
| JP | 2003-188620 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-529163 A | 9/2003 |
| JP | 2003-288560 A | 10/2003 |
| JP | 2003-309418 A | 10/2003 |
| JP | 2003-317060 A | 11/2003 |
| JP | 2003-331246 A | 11/2003 |
| JP | 2003-332820 A | 11/2003 |
| JP | 2003-536302 A | 12/2003 |
| JP | 2004-040597 A | 2/2004 |
| JP | 2004-505481 A | 2/2004 |
| JP | 2004-082775 A | 3/2004 |
| JP | 2004-88218 A | 3/2004 |
| JP | 2004-93693 A | 3/2004 |
| JP | 2004-096566 A | 3/2004 |
| JP | 2004-096618 A | 3/2004 |
| JP | 2004-126750 A | 4/2004 |
| JP | 2004-127230 A | 4/2004 |
| JP | 2004-140513 A | 5/2004 |
| JP | 2004-163134 A | 6/2004 |
| JP | 2004-213582 A | 7/2004 |
| JP | 2004-519916 A | 7/2004 |
| JP | 2004-234595 A | 8/2004 |
| JP | 2004-253858 A | 9/2004 |
| JP | 2004-527864 A | 9/2004 |
| JP | 2004-280390 A | 10/2004 |
| JP | 2004-282403 A | 10/2004 |
| JP | 2004-287767 A | 10/2004 |
| JP | 2004-295297 A | 10/2004 |
| JP | 2004-297249 A | 10/2004 |
| JP | 2004-297681 A | 10/2004 |
| JP | 2004-304370 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-18156 A | 1/2005 |
| JP | 2005-033461 A | 2/2005 |
| JP | 2005-064799 A | 3/2005 |
| JP | 2005-124061 A | 5/2005 |
| JP | 2005-128592 A | 5/2005 |
| JP | 2005-129019 A | 5/2005 |
| JP | 2005-135132 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |
| JP | 2005-192124 A | 7/2005 |
| JP | 2005-204038 A | 7/2005 |
| JP | 2005-210223 A | 8/2005 |
| JP | 2005-210676 A | 8/2005 |
| JP | 2005-210680 A | 8/2005 |
| JP | 2005-217822 A | 8/2005 |
| JP | 2005-229474 A | 8/2005 |
| JP | 2005-236339 A | 9/2005 |
| JP | 2005-244778 A | 9/2005 |
| JP | 2005-252853 A | 9/2005 |
| JP | 2005-275870 A | 10/2005 |
| JP | 2005-284352 A | 10/2005 |
| JP | 2005-284455 A | 10/2005 |
| JP | 2005-293537 A | 10/2005 |
| JP | 2005-295135 A | 10/2005 |
| JP | 2005-311205 A | 11/2005 |
| JP | 2005-321305 A | 11/2005 |
| JP | 2005-322119 A | 11/2005 |
| JP | 2005-335755 A | 12/2005 |
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-13976 A | 1/2006 |
| JP | 2006-013976 A | 1/2006 |
| JP | 2006-025390 A | 1/2006 |
| JP | 2006-031766 A | 2/2006 |
| JP | 2006-033312 A | 2/2006 |
| JP | 2006-39902 A | 2/2006 |
| JP | 2006-039947 A | 2/2006 |
| JP | 2006-42059 A | 2/2006 |
| JP | 2006-42097 A | 2/2006 |
| JP | 2006-050200 A | 2/2006 |

(56) References Cited

FOREIGN PATENT DOCUMENTS

| | | |
|---|---|---|
| JP | 2006-053833 A | 2/2006 |
| JP | 2006-67479 A | 3/2006 |
| JP | 2006-72706 A | 3/2006 |
| JP | 2006-074348 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148462 A | 6/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-238282 A | 9/2006 |
| JP | 2006-246372 A | 9/2006 |
| JP | 2006-270212 A | 10/2006 |
| JP | 2006-270681 A | 10/2006 |
| JP | 2006-270766 A | 10/2006 |
| JP | 2006-285911 A | 10/2006 |
| JP | 2006-287659 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2006-339964 A | 12/2006 |
| JP | 2007-007888 A | 1/2007 |
| JP | 2007-13120 A | 1/2007 |
| JP | 2007-18067 A | 1/2007 |
| JP | 2007-019905 A | 1/2007 |
| JP | 2007-28002 A | 2/2007 |
| JP | 2007-040702 A | 2/2007 |
| JP | 2007-043535 A | 2/2007 |
| JP | 2007-048126 A | 2/2007 |
| JP | 2007-65822 A | 3/2007 |
| JP | 2007-79687 A | 3/2007 |
| JP | 2007-81712 A | 3/2007 |
| JP | 2007-096768 A | 4/2007 |
| JP | 2007-102348 A | 4/2007 |
| JP | 2007-116347 A | 5/2007 |
| JP | 2007-122542 A | 5/2007 |
| JP | 2007-150642 A | 6/2007 |
| JP | 2007-150868 A | 6/2007 |
| JP | 2007-159083 A | 6/2007 |
| JP | 2007-159129 A | 6/2007 |
| JP | 2007-166133 A | 6/2007 |
| JP | 3975918 B2 | 6/2007 |
| JP | 2007-172369 A | 7/2007 |
| JP | 2007-172527 A | 7/2007 |
| JP | 2007-524942 A | 8/2007 |
| JP | 2007-228254 A | 9/2007 |
| JP | 2007-228325 A | 9/2007 |
| JP | 2007-233597 A | 9/2007 |
| JP | 2007-241789 A | 9/2007 |
| JP | 2007-266999 A | 10/2007 |
| JP | 2007-272264 A | 10/2007 |
| JP | 2007-287128 A | 11/2007 |
| JP | 2007-295557 A | 11/2007 |
| JP | 2007-312350 A | 11/2007 |
| JP | 2007-324865 A | 12/2007 |
| JP | 2008-033716 A | 2/2008 |
| JP | 2008-042910 A | 2/2008 |
| JP | 2008-72243 A | 3/2008 |
| JP | 2008-083867 A | 4/2008 |
| JP | 2008-092131 A | 4/2008 |
| JP | 2008-097426 A | 4/2008 |
| JP | 2008-098993 A | 4/2008 |
| JP | 4069958 B2 | 4/2008 |
| JP | 2008-103691 A | 5/2008 |
| JP | 2008-107947 A | 5/2008 |
| JP | 2008-513888 A | 5/2008 |
| JP | 2008-148345 A | 6/2008 |
| JP | 2008-519347 A | 6/2008 |
| JP | 2008-160874 A | 7/2008 |
| JP | 2008-167190 A | 7/2008 |
| JP | 2008-197714 A | 8/2008 |
| JP | 2008-535372 A | 8/2008 |
| JP | 2008-207875 A | 9/2008 |
| JP | 2008-217406 A | 9/2008 |
| JP | 2008-288915 A | 11/2008 |
| JP | 2009-017284 A | 1/2009 |
| JP | 2009-021970 A | 1/2009 |
| JP | 2009-25870 A | 2/2009 |
| JP | 2009-27291 A | 2/2009 |
| JP | 2009-044647 A | 2/2009 |
| JP | 2009-044715 A | 2/2009 |
| JP | 3148168 U | 2/2009 |
| JP | 2009-110144 A | 5/2009 |
| JP | 2009-153166 A | 7/2009 |
| JP | 2009-182630 A | 8/2009 |
| JP | 2009-213169 A | 9/2009 |
| JP | 2010-009196 A | 1/2010 |
| JP | 2010-050844 A | 3/2010 |
| JP | 2010-081571 | 4/2010 |
| JP | 4609604 B2 | 1/2011 |
| NL | 9100176 A | 3/1992 |
| NL | 9100347 A | 3/1992 |
| WO | 98/33142 A1 | 7/1998 |
| WO | 99/67754 A1 | 12/1999 |
| WO | 00/10122 A2 | 2/2000 |
| WO | 01/95242 A2 | 12/2001 |
| WO | 02/48980 A1 | 6/2002 |
| WO | 02/061675 A1 | 8/2002 |
| WO | 02/097723 A1 | 12/2002 |
| WO | 03/079305 A1 | 9/2003 |
| WO | 2004/036772 A2 | 4/2004 |
| WO | 2004/070879 A | 8/2004 |
| WO | 2004/072892 A2 | 8/2004 |
| WO | 2005/073937 A | 8/2005 |
| WO | 2005/091434 A1 | 9/2005 |
| WO | 2005/115849 A1 | 12/2005 |
| WO | 2006/045682 A | 5/2006 |
| WO | 2006/048663 A1 | 5/2006 |
| WO | 2006/114821 A1 | 11/2006 |
| WO | 2007/083574 A1 | 7/2007 |
| WO | 2007/083575 A1 | 7/2007 |
| WO | 2007/086130 A1 | 8/2007 |
| WO | 2007/094494 A1 | 8/2007 |
| WO | 2007/097385 A1 | 8/2007 |
| WO | 2007/102360 A1 | 9/2007 |
| WO | 2007/105348 A1 | 9/2007 |
| WO | 2007/119310 A1 | 10/2007 |
| WO | 2007/125683 A1 | 11/2007 |
| WO | 2007/132094 A1 | 11/2007 |
| WO | 2007/138857 A1 | 12/2007 |
| WO | 2008/007606 A | 1/2008 |
| WO | 2008/081699 A1 | 7/2008 |
| WO | 2008/126458 A1 | 10/2008 |
| WO | 2008/133018 A1 | 11/2008 |
| WO | 2008/140037 A1 | 11/2008 |
| WO | 2008/142957 A1 | 11/2008 |
| WO | 2009/008296 A1 | 1/2009 |
| WO | 2009/011144 A1 | 1/2009 |
| WO | 2009/011376 A1 | 1/2009 |
| WO | 2009/011400 A1 | 1/2009 |
| WO | 2009/011423 A1 | 1/2009 |
| WO | 2009/081719 A1 | 7/2009 |
| WO | 2009/110381 A1 | 9/2009 |
| WO | 2009/119548 A1 | 10/2009 |
| WO | 2009/128437 A1 | 10/2009 |
| WO | 2010/026939 A1 | 3/2010 |

OTHER PUBLICATIONS

English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.

(56) References Cited

OTHER PUBLICATIONS

Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Offical communication issued in International Application No. PCT/JP2008/050356, mailed on Mar. 25, 2008.
Osamura et al.: "Packaging Material With Electromagnetic Coupling Module,"; U.S. Appl. No. 12/536,663, filed Aug. 6, 2009.
Osamura et al.: "Packaging Material With Electromagnetic Coupling Module,"; U.S. Appl. No. 12/536,669, filed Aug. 6, 2009.
Dokai et al.: "Wireless IC Device and Component for Wireless IC Device,"; U.S. Appl. No. 12/543,553, filed Aug. 19, 2009.
Shioya et al.: "Wireless IC Device,"; U.S. Appl. No. 12/551,037, filed Aug. 31, 2009.
Ikemoto: "Wireless IC Device and Manufacturing Method Thereof,"; U.S. Appl. No. 12/579,672, filed Oct. 15, 2009.
Official communication issued in International Application No. PCT/JP2008/058614, mailed on Jun. 10, 2008.
Official Communication issued in International Patent Application No. PCT/JP2009/069486, mailed on Mar. 2, 2010.
Kato: "Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, mailed on Mar. 16, 2010.
Nagai, "Mounting Technique of RFID by Roll-To-Roll Process", Material Stage, Technical Information Institute Co., LTD, vol. 7, No. 9, 2007, pp. 4-12.
Dokai et al.: "Wireless IC Device"; U.S. Appl. No. 13/088,480, filed Apr. 18, 2011.
Kato et al.: "High-Frequency Device and Wireless IC Device"; U.S. Appl. No. 13/094,928, filed Apr. 27, 2011.
Dokai et al.: "Wireless IC Device"; U.S. Appl. No. 13/099,392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Shiroki et al.: "RFIC Chip Mounting Structure"; U.S. Appl. No. 13/223,429, filed Sep. 1, 2011.
Official Communication issued in International Patent Application No. PCT/JP2010/056559, mailed on Jul. 27, 2010.
Taniguchi et al.: "Antenna Device and Radio Frequency IC Device"; U.S. Appl. No. 13/232,102, filed Sep. 14, 2011.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010.
Official Communication issued in corresponding Japanese Patent Application No. 2011-032311, mailed on Mar. 29, 2011.
Official Communication issued in corresponding Japanese Patent Application No. 2009-525327, drafted on Sep. 22, 2010.
Official Communication issued in corresponding Japanese Patent Application No. 2011-032311, mailed on Aug. 2, 2011.
Official Communication issued in corresponding Japanese Patent Application No. 2011-032312, mailed on Aug. 2, 2011.
Official Communication issued in corresponding Japanese Patent Application No. 2011-032311, mailed on Aug. 23, 2011.
Kato et al.: "Wireless IC Device Component and Wireless IC Device"; U.S. Appl. No. 13/241,823, filed Sep. 23, 2011.
Kato et al.: "Antenna Device and Method of Setting Resonant Frequency of Antenna Device"; U.S. Appl. No. 13/272,365, filed Oct. 13, 2011.
Offical Communication issued in International Patent Application No. PCT/JP2010/056812, mailed on Jul. 13, 2010.
Dokai et al.: "Optical Disc"; U.S. Appl. No. 13/295,153, filed Nov. 14, 2011.
Official Communication issued in International Patent Application No. PCT/JP2010/057668, mailed on Aug. 17, 2010.
Osamura et al.: "Radio Frequency IC Device and Method of Manufacturing the Same"; U.S. Appl. No. 13/308,575, filed Dec. 1, 2011.
Official Communication issued in International Patent Application No. PCT/JP2010/069417, mailed on Dec. 7, 2010.
Kato: "Wireless IC Device and Coupling Method for Power Feeding Circuit and Radiation Plate"; U.S. Appl. No. 13/325,273, filed Dec. 14, 2011.
Official Communication issued in International Patent Application No. PCT/JP2010/053496, mailed on Jun. 1, 2010.
Ikemoto: "Wireless IC Tag, Reader-Writer, and Information Processing System"; U.S. Appl. No. 13/329,354, filed Dec. 19, 2011.
Kato et al.: "Antenna and Antenna Module"; U.S. Appl. No. 13/334,462, filed Dec. 22, 2011.
Official Communication issued in International Patent Application No. PCT/JP2010/069418, mailed on Feb. 8, 2011.
Official Communication issued in International Patent Application No. PCT/JP2010/063082, mailed on Nov. 16, 2010.
Ikemoto: "Communication Terminal and Information Processing System"; U.S. Appl. No. 13/412,772, filed Mar. 6, 2012.
"Antenna Engineering Handbook", The Institute of Electronics and Communication Engineers, Mar. 5, 1999, pp. 20-21.
Official Communication issued in International Patent Application No. PCT/JP2010/066714, mailed on Dec. 14, 2010.
Nomura et al.: "Antenna and Wireless IC Device"; U.S. Appl. No. 13/419,454, filed Mar. 14, 2012.
Official Communication issued in International Patent Application No. PCT/JP2010/070607, mailed on Feb. 15, 2011.
Ito: "Wireless IC Device and Method of Detecting Environmental State Using the Device"; U.S. Appl. No. 13/421,889, filed Mar. 16, 2012.

(56) References Cited

OTHER PUBLICATIONS

Official Communication issued in International Patent Application No. PCT/JP2011/053654, mailed on Mar. 29, 2011.
Kato et al.: "Antenna Device and Mobile Communication Terminal"; U.S. Appl. No. 13/425,505, filed Mar. 21, 2012.
Official Communication issued in International Patent Application No. PCT/JP2010/069416, mailed on Feb. 8, 2011.
Kato et al.: "Wireless Communication Device and Metal Article"; U.S. Appl. No. 13/429,465, filed Mar. 26, 2012.
Official Communication issued in International Patent Application No. PCT/JP2011/055344, mailed on Jun. 14, 2011.
Kubo et al.: "Antenna and Mobile Terminal"; U.S. Appl. No. 13/452,972, filed Apr. 23, 2012.
Ikemoto: "RFID System"; U.S. Appl. No. 13/457,525, filed Apr. 27, 2012.
Ikemoto et al.: "Wireless IC Device and Electronic Apparatus"; U.S. Appl. No. 13/468,058, filed May 10, 2012.
Official communication issued in counterpart International Application No. PCT/JP2008/071502, mailed Feb. 24, 2009.
Kato et al.: "Wireless IC Device and Manufacturing Method Thereof,"; U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device,"; U.S. Appl. No. 12/469,896, filed May 21, 2009.
Ikemoto et al.: "Wireless IC Device,"; U.S. Appl. No. 12/496,709, filed Jul. 2, 2009.
Official communication issued in counterpart International Application No. PCT/JP2008/062947, mailed Aug. 19, 2008.
Offical communication issued in counterpart International Application No. PCT/JP2008/056026, mailed Jul. 1, 2008.
Ikemoto et al.: "Wireless IC Device and Eletronic Apparatus,"; U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device,"; U.S. Appl. No. 12/510,338, filed Jul. 28, 2009.
Kato et al.: "Wireless IC Device,"; U.S. Appl. No. 12/510,340, filed Jul. 28, 2009.
Kato: "Wireless IC Device,"; U.S. Appl. No. 12/510,344, filed Jul. 28, 2009.
Kato et al.: "Wireless IC Device,"; U.S. Appl. No. 12/510,347, filed Jul. 28, 2009.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Offical communication issued in Japanese Application No. 2007-531524, mailed on Sep. 11, 2007.
Offical communication issued in Japanese Application No. 2007-531525, mailed on Sep. 25, 2007.
Offical communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
Offical Communication issued in International Patent Application No. PCT/JP2008/063025, mailed on Aug. 12, 2008.
Kato et al.: "Wireless IC Device,"; U.S. Appl. No. 12/603,608, filed Oct. 22, 2009.
Kato et al.: "Wirelress IC Device,"; U.S. Appl. No. 12/688,072, filed Jan. 15, 2010.
Offical Communication issued in International Patent Application No. PCT/JP2009/053693, mailed on Jun. 9, 2009.
Kato: "Composite Antenna,"; U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System,"; U.S. Appl. No. 12/859,340, filed Aug. 19, 2010.

(56) References Cited

OTHER PUBLICATIONS

Official Communication issued in International Patent Application No. PCT/JP2009/055758, mailed on Jun. 23, 2009.
Kato et al.: "Wireless IC Device,"; U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device,"; U.S. Appl. No. 12/861,945, filed Aug. 24, 2010.
Kato: "Wireless IC Device and Electromagnetic Coupling Module,"; U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device"; U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
Official Communication issued in International Patent Application No. PCT/JP2010/066291, mailed on Dec. 28, 2010.
Ikemoto: "Communication Terminal and Information Processing System"; U.S. Appl. No. 13/432,002, filed Mar. 28, 2012.
Official Communication issued in International Patent Application No. PCT/JP2010/070767, mailed on Feb. 22, 2011.
Ieki et al.: "Transceiver and Radio Frequency Identification Tag Reader"; U.S. Appl. No. 13/437,978, filed Apr. 3, 2012.
Official Communication issued in International Patent Application No. PCT/JP2011/065431, mailed on Oct. 18, 2011.
Kato et al.: "Wireless IC Device"; U.S. Appl. No. 13/470,486, filed May 14, 2012.
Kato: "Wireless IC Device"; U.S. Appl. No. 12/789,610, filed May 28, 2010.
Kato: "Antenna and RFID Device"; U.S. Appl. No. 13/472,520, filed May 16, 2012.
Kato et al.: "Wireless IC Device and Component for Wireless IC Device"; U.S. Appl. No. 13/540,694, filed Jul. 3, 2012.
Dokai et al.: "Wireless IC Device and Component for Wireless IC Device"; U.S. Appl. No. 13/567,108, filed Aug. 6, 2012.
Dokai et al.: "Wireless IC Device and Component for Wireless IC Device"; U.S. Appl. No. 13/567,109, filed Aug. 6, 2012.
Official Communication issued in corresponding European Patent Application No. 13153273.1, mailed on Mar. 7, 2013.

\* cited by examiner

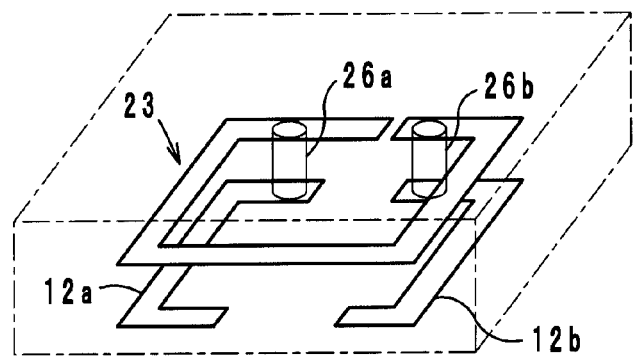
FIG. 14
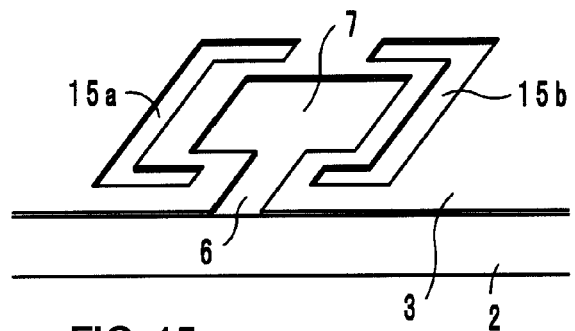
FIG. 15
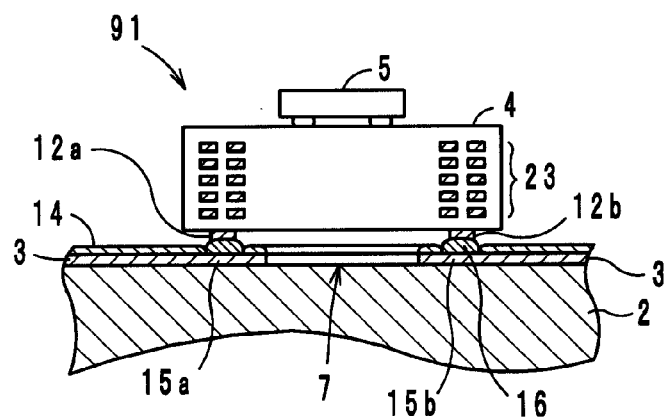

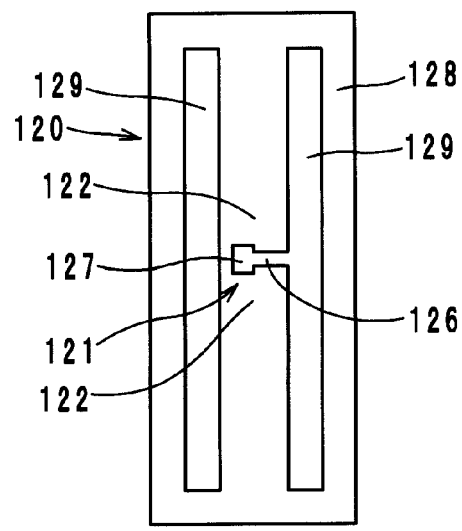
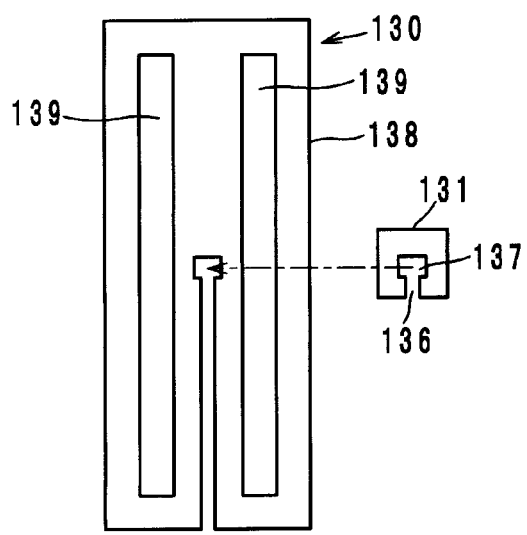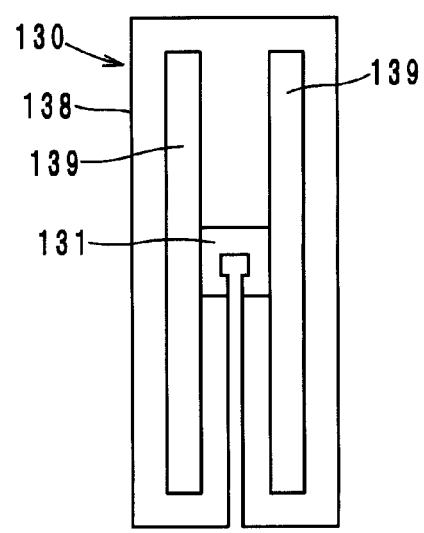

WIRELESS IC DEVICE

BACKGROUND OF THE INVENTION

1. Field of the Invention

The present invention relates to wireless integrated circuit (IC) devices including wireless ICs and radiation plates. More particularly, the present invention relates to a wireless IC device used in a radio frequency identification (RFID) system.

2. Description of the Related Art

RFID systems have been developed as article management systems in recent years. In such a RFID system, a reader-writer that generates an induced magnetic field communicates with an IC tag (hereinafter referred to as a wireless IC device) that is attached to an article and that stores information by a non-contact method using the electromagnetic field to transfer information.

The wireless IC device used in an RFID system includes a wireless IC chip arranged to process a specific radio signal and a radiation plate arranged to transmit and receive the radio signal. For example, a known wireless IC device is described in WO 2007/083574.

The wireless IC device described in WO 2007/083574 includes a wireless IC chip, a power-supply circuit board on which the wireless IC chip is mounted and which includes a power supply circuit including a resonant circuit having a desired resonant frequency, and a radiation plate which is adhered to a bottom surface of the power-supply circuit board and which radiates a transmission signal supplied from the power supply circuit and receives a reception signal to supply the received reception signal to the power supply circuit. The resonant frequency of the resonant circuit in the power-supply circuit board is designed so as to substantially correspond to the frequency of the transmission and reception signals, such that the wireless IC device has very stable frequency characteristics.

Since the frequency of the radio signal transmitted and received by the radiation plate is substantially determined by the power supply circuit in the power-supply circuit board in the wireless IC device described in WO 2007/083574, the wireless IC device has very good characteristics in that the frequency of the radio signal does not significantly depend on the size and/or shape of the radiation plate. However, for example, as described in Paragraph [0020] in WO 2007/083574, the magnitude of the gain of the radio signal depends on the size and/or shape of the radiation plate. In other words, the gain varies depending on the size and/or shape of the radiation plate. However, a satisfactory configuration for successfully controlling the gain is not disclosed in WO 2007/083574.

SUMMARY OF THE INVENTION

To overcome the problems described above, preferred embodiments of the present invention provide a wireless IC device which effectively controls the gain of transmission and reception signals.

A wireless IC device according to a preferred embodiment of the present invention includes a wireless IC arranged to process a specific radio signal, a power-supply circuit board that is connected to the wireless IC and that includes a power supply circuit including at least one coil pattern, and a radiation plate arranged to radiate a transmission signal supplied from the power-supply circuit board and/or to receive a reception signal to supply the reception signal to the power-supply circuit board. The radiation plate includes an opening provided in a portion thereof and a slit connected to the opening and, when viewed in plan from the direction of the winding axis of the coil pattern, the opening in the radiation plate overlaps with at least a portion of an inner area of the coil pattern.

In the wireless IC device according to a preferred embodiment of the present invention, the radiation plate preferably includes the opening provided in a portion thereof and the slit connected to the opening and, when viewed in plan from the direction of the winding axis of the coil pattern in the power-supply circuit board, the opening in the radiation plate overlaps with at least a portion of an inner area of the coil pattern. Accordingly, when a current flows through the coil pattern, a magnetic field that is excited is ideally distributed through the opening in the coil pattern. The induced magnetic field excites an induced current around the opening in the radiation plate and a difference in voltage is applied to the induced current in the slit. Accordingly, the amount and/or distribution of the induced current can be controlled by changing the length and/or width of the slit so as to control the amounts of the electric field and the magnetic field occurring over the radiation plate, thus enable effective control of the gain of the transmission and reception signals.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 1A to 1C include diagrams showing a wireless IC device according to a first preferred embodiment of the present invention wherein FIG. 1A is a perspective view of the entire device, FIG. 1B is a perspective view showing a state in which a wireless IC chip is mounted on a power-supply circuit board, and FIG. 1C is a perspective view showing a state in which the power-supply circuit board is mounted on a radiation plate.

FIGS. 5A to 5C include diagrams showing the principle of the operation of the wireless IC device of the first preferred embodiment of the present invention wherein FIG. 5A is a cross-sectional view, FIG. 5B is a plan view around an opening, and FIG. 5C is a plan view showing propagation to the radiation plate.

FIGS. 8A and 8B include diagrams showing a wireless IC device of a second preferred embodiment of the present invention wherein FIG. 8A is a plan view and FIG. 8B is an enlarged plan view of a modification of the second preferred embodiment of the present invention.

FIG. 14 is a perspective view showing a main portion of a wireless IC device of a sixth preferred embodiment of the present invention.

FIG. 15 is a cross-sectional view showing the wireless IC device of the sixth preferred embodiment of the present invention.

FIG. 18 is a plan view showing a third modification of the radiation plate.

FIGS. 19A and 19B include diagrams showing a fourth modification of the radiation plate wherein FIG. 19A is an exploded plan view and FIG. 19B is a plan view in a combined state.

DETAILED DESCRIPTION OF THE PREFERRED EMBODIMENTS

Figure 1A:
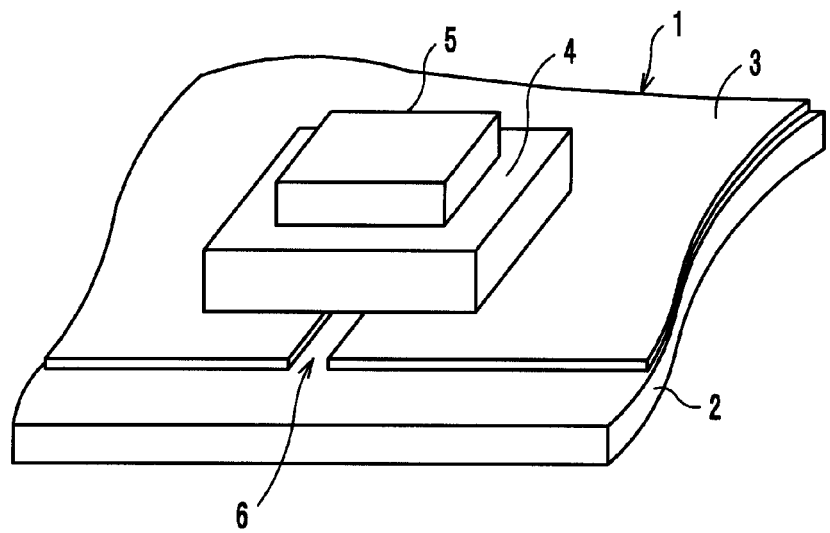

Wireless IC devices according to preferred embodiments of the present invention will be described below with reference to the drawings. The same reference numerals are used to identify parts and components common to the drawings. A duplicated description of such parts and components is omitted herein.

First Preferred Embodiment

Figure 1B:
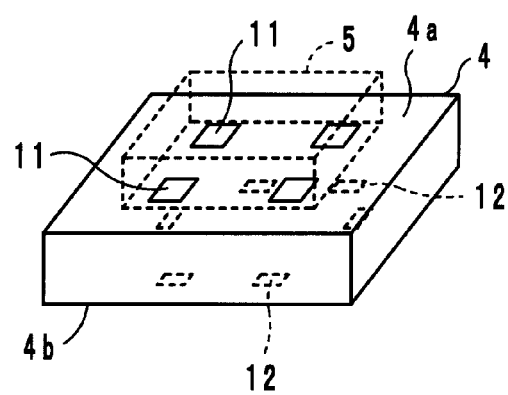
Figure 1C:
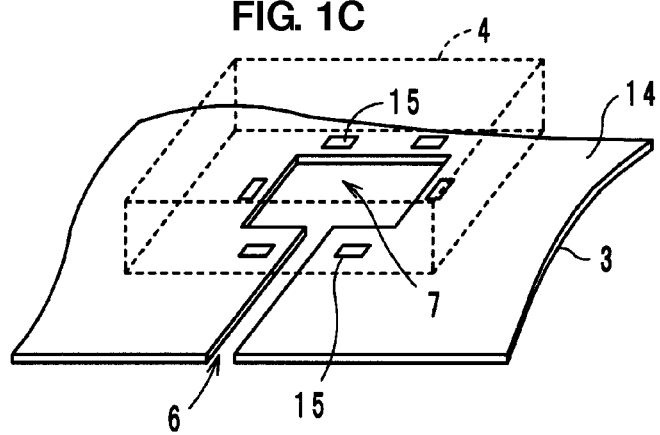

The configuration of a wireless IC device of a first preferred embodiment of the present invention will now be described with reference to FIGS. 1A to 1C. As shown in FIGS. 1A to 1C, in a wireless IC device 1, a radiation plate 3 defined by a metallic film, such as a metallic foil, for example, is provided on a support base 2, which is, for example, a printed circuit board. A power-supply circuit board 4 is mounted on the radiation plate 3. The power-supply circuit board 4 includes a power supply circuit including at least one coil pattern, and a wireless IC chip 5 arranged to process a specific radio signal is mounted on the power-supply circuit board 4. Specifically, the wireless IC chip 5 is mounted on one main surface 4a of the power-supply circuit board 4, and the power-supply circuit board is mounted on the radiation plate 3 with the other main surface 4b of the power-supply circuit board 4 defining the mounting surface. The wireless IC chip 5 includes a clock circuit, a logic circuit, a memory circuit, and other suitable circuit elements, and necessary information is stored in the wireless IC chip 5.

As shown in FIG. 1B, multiple connection electrodes 11 via which the wireless IC chip 5 is mounted on and connected to the power-supply circuit board 4 are provided on the one main surface 4a of the power-supply circuit board 4. The connection electrodes 11 are electrically connected to respective multiple connection electrodes (not shown) provided on the rear surface of the wireless IC chip 5 via conductive bonds 8 (see, for example, FIG. 10) such as solder, for example. As a result, the wireless IC chip 5 is mounted on the one main surface 4a of the power-supply circuit board 4. In addition, mounting electrodes 12 via which the power-supply circuit board 4 is mounted on the radiation plate 3 are provided on the other main surface 4b of the power-supply circuit board 4.

As shown in FIG. 1C, the radiation plate 3 includes an opening 7 provided in a portion thereof and a slit 6 connected to the opening 7. One end of the slit is connected to the opening 7 and the other end thereof opens at a side edge of the radiation plate 3. In other words, the slit 6 is arranged so as to communicate the opening 7 with the side edge of the radiation plate 3. Although the slit 6 preferably has a substantially straight shape, as in the first preferred embodiment, in terms of the workability, the slit 6 may have a meandering shape or a curved shaped.

Furthermore, multiple mounting electrodes 15 via which the power-supply circuit board 4 is mounted on and connected to the periphery of the opening 7 are provided on the radiation plate 3. The mounting electrodes 15 are preferably connected to the mounting electrodes 12 provided on the other main surface 4b of the power-supply circuit board 4 via conductive bonds 16, such as solder, for example (see, for example, FIG. 5A). The mounting electrodes 15 are preferably defined by apertures resulting from partially striping a protective layer 14 that is coated on the surface of the radiation plate 3 and that is made of a resist material or other suitable material, for example. In other words, a portion of the radiation plate 3, which corresponds to the open portions in the protective layer 14, defines the mounting electrodes 15.

In the first preferred embodiment, the mounting electrodes 12 provided on the other main surface 4b of the power-supply circuit board 4 are preferably not directly connected to the power supply circuit provided inside the power-supply circuit board 4. The mounting electrodes 12 are preferably connected to the mounting electrodes 15 defined by a portion of the radiation plate 3 via the conductive bonds 16, such as solder.

Figure 2:
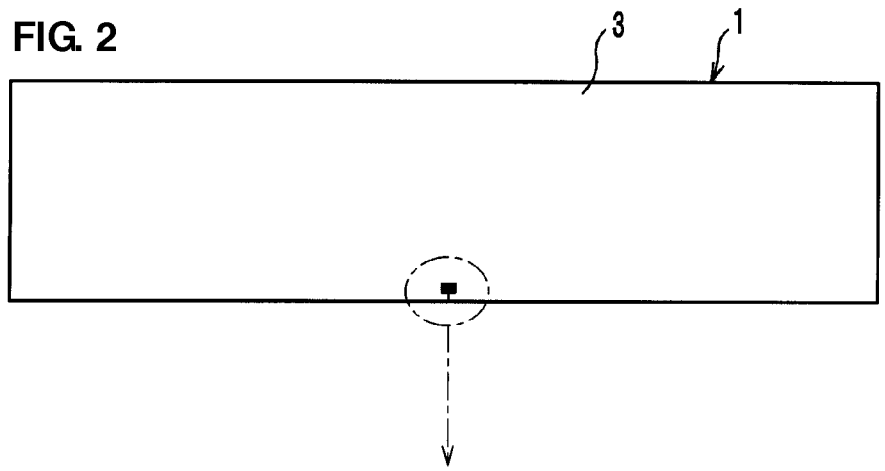
FIG. 2 is a plan view showing the wireless IC device of the first preferred embodiment of the present invention.

The radiation plate 3 preferably has a substantially planar rectangular shape, for example, as shown in FIG. 2, and the power-supply circuit board 4 on which the wireless IC chip 5 is mounted is mounted at a substantially central portion near one longitudinal side edge of the radiation plate 3. In the first preferred embodiment, for example, a ground electrode that is incorporated in an electronic device, such as a mobile phone or a personal computer, and that is provided on a printed circuit board including a certain electronic circuit may be used as the radiation plate 3. In other words, although the radiation plate 3 may be provided as a separate element having only a radiation function, ground electrodes used in various electronic circuits may alternatively be used as the radiation plate 3.

Figure 3:
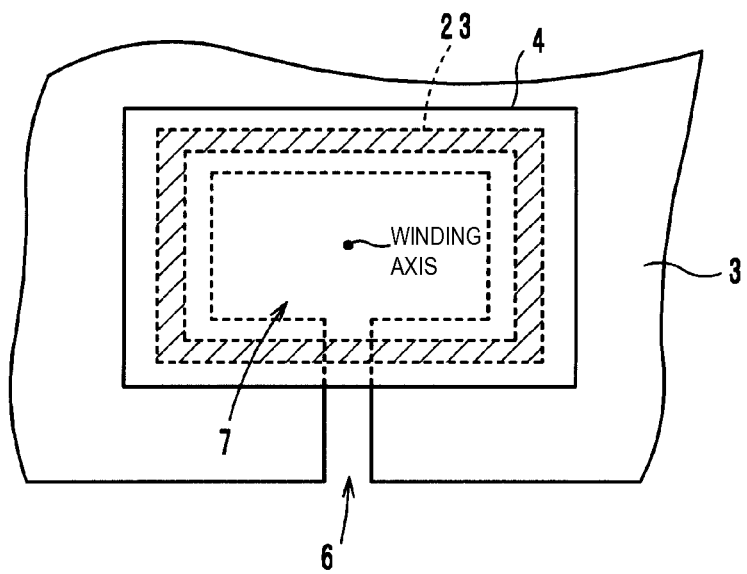
FIG. 3 is a schematic plan view showing a main portion of the wireless IC device of the first preferred embodiment of the present invention.

In relation to a coil pattern 23, shown in FIG. 3, provided in the power-supply circuit board 4, the opening 7 provided in the radiation plate 3 overlaps with at least a portion of an inner area of the winding path of the coil pattern 23, when viewed in plan from the direction of the winding axis of the coil pattern 23. As shown in FIG. 3, the opening 7 preferably substantially entirely overlaps with the inner area of the coil pattern 23 and the opening 7 preferably has approximately the same area as that of the inner area of the coil pattern 23. This is because magnetic fields H, shown in FIG. 5A, caused by the coil pattern 23 efficiently spread over the radiation plate 3 to suppress loss and improve the gain.

The power-supply circuit board 4 in the first preferred embodiment includes a multilayer body in which a plurality of dielectric layers preferably defined by resin layers or ceramic layers, for example, are layered. Preferably, the coil pattern 23 of the power supply circuit includes a plurality of annular electrodes arranged on the plurality of dielectric layers that are connected to one another via interlayer conductors in the layered direction in a helical pattern having the winding axis. However, the power-supply circuit board may include a coil pattern provided on a single-layer board.

Figure 4:
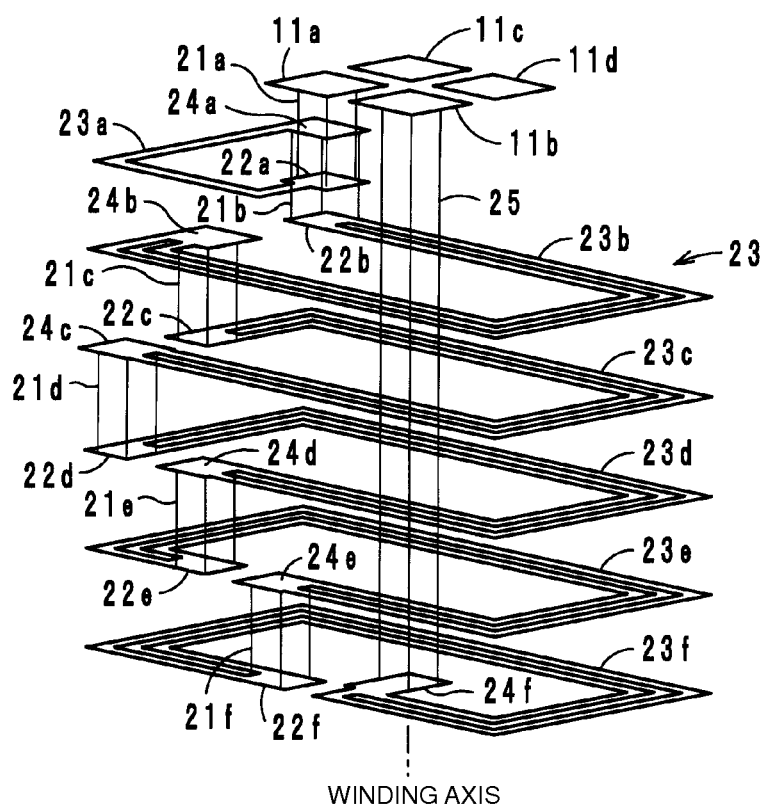
FIG. 4 is a schematic perspective view showing the internal configuration of the power-supply circuit board included in the wireless IC device of the first preferred embodiment of the present invention.

As shown in FIG. 4, the power-supply circuit board 4 including the helical coil pattern 23 supplies a transmission signal from the wireless IC chip 5 to the radiation plate 3 and supplies a reception signal from the radiation plate 3 to the wireless IC chip 5.

The power supply circuit will now be specifically described. A connection electrode 11a arranged to be connected to the connection electrode on the wireless IC chip 5 is connected to a pad conductor 22a provided on another layer via an interlayer connection conductor 21a provided in the multilayer body, and a wiring conductor 23a that extends from the pad conductor 22a and that defines a portion of the coil pattern 23 on the corresponding layer is arranged in a substantially annular shape to be connected to a pad conductor 24a provided on the same layer. The pad conductor 24a is connected to a pad conductor 22b provided on another layer via an interlayer connection conductor 21b, and a wiring conductor 23b that extends from the pad conductor 22b and that defines a portion of the coil pattern 23 on the corresponding layer is arranged in a substantially annular pattern to be connected to a pad conductor 24b provided on the same layer.

Furthermore, the pad conductor 24b is connected to a pad conductor 22c provided on another layer via an interlayer connection conductor 21c, and a wiring conductor 23c that extends from the pad conductor 22c and that defines a portion of the coil pattern 23 on the corresponding layer is arranged in a substantially annular pattern to be connected to a pad conductor 24c provided on the same layer. The pad conductor 24c is connected to a pad conductor 22d provided on another layer via an interlayer connection conductor 21d, and a wiring conductor 23d that extends from the pad conductor 22d and that defines a portion of the coil pattern 23 on the corresponding layer is routed in an annular pattern to be connected to a pad conductor 24d provided on the same layer.

Furthermore, the pad conductor 24d is connected to a pad conductor 22e provided on another layer via an interlayer connection conductor 21e, and a wiring conductor 23e that extends from the pad conductor 22e and that defines a portion of the coil pattern 23 on the corresponding layer is arranged in a substantially annular pattern to be connected to a pad conductor 24e provided on the same layer. The pad conductor 24e is connected to a pad conductor 22f provided on another layer via an interlayer connection conductor 21f, and a wiring conductor 23f that extends from the pad conductor 22f and that defines a portion of the coil pattern 23 on the corresponding layer is arranged in a substantially annular pattern to be connected to a pad conductor 24f provided on the same layer. The pad conductor 24f is connected to a connection electrode 11b via an interlayer connection conductor 25.

In other words, the interlayer connection conductors 21a to 21f, the pad conductors 22a to 22f, the substantially annular wiring conductors 23a to 23f, the pad conductors 24a to 24f, and the interlayer connection conductor 25 define the coil pattern 23. Electrodes 11c and 11d are provided on the surface of the multilayer body defining the power-supply circuit board 4. The electrodes 11c and 11d function as mounting electrodes to mount the wireless IC chip 5 and are not connected to the coil pattern 23 provided in the power-supply circuit board 4.

Figure 5A:
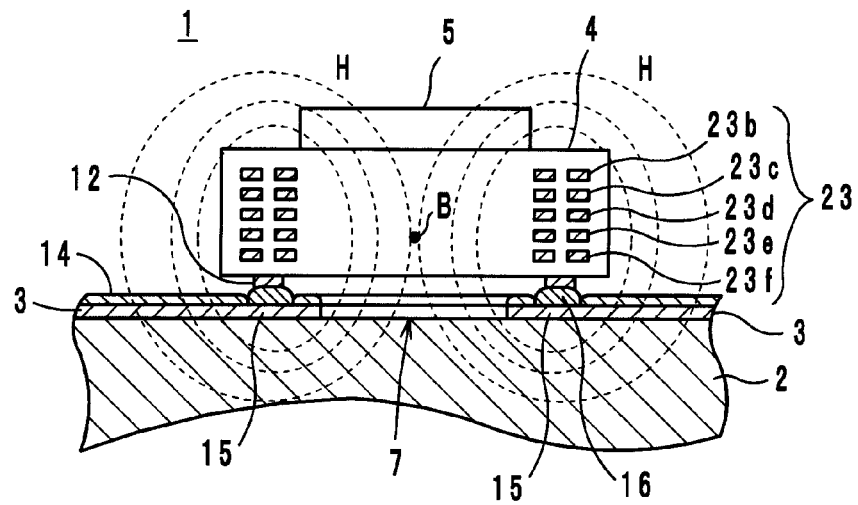

As described above, in the first preferred embodiment, the radiation plate 3 includes the opening 7 provided in a portion thereof and the slit 6 connected to the opening 7. The opening 7 overlaps with the inner area of the coil pattern 23, when viewed in plan from the direction of the winding axis of the coil pattern 23 provided in the power-supply circuit board 4. In addition, the opening 7 preferably has approximately the same area as that of the inner area of the coil pattern 23. Accordingly, as shown in FIG. 5A, for example, during the transmission of a radio signal, a signal current flows from the wireless IC chip 5 to the coil pattern 23 and the induced magnetic fields H caused by the current is ideally distributed through the opening 7, as shown by broken lines in FIG. 5A. The ideal distribution of the magnetic fields H means that a center B of the two magnetic fields H coincides with the center of the opening 7. The gain of the radiation plate 3 is maximized in this state.

Figure 5B:
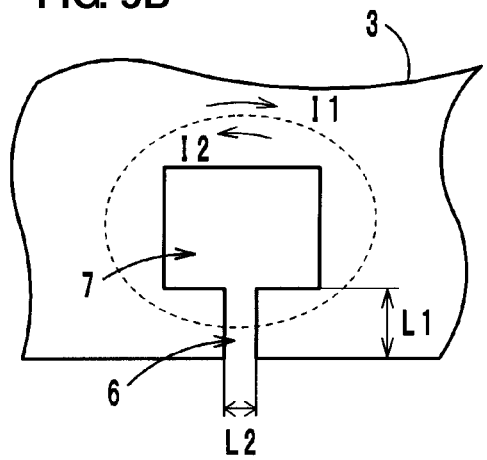

The induced magnetic fields H cause induced currents I1 and I2 (the propagation direction of the current I1 differs from that of the current I2 by 180 degrees) around the opening 7, as shown in FIG. 5B. Since the slit 6 is connected to the opening 7, the flows of the induced currents I1 and I2 are restricted by the slit 6 to produce a difference in voltage, i.e., to produce a capacitance. Accordingly, the amounts and/or distributions of the induced currents I1 and I2 can be effectively controlled by adjusting a length L1 and/or a width L2 of the slit 6 to control the amounts of the electric field and the magnetic field produced over the radiation plate 3. As a result, it is possible to effectively control the gain of the transmission signal.

Figure 5C:
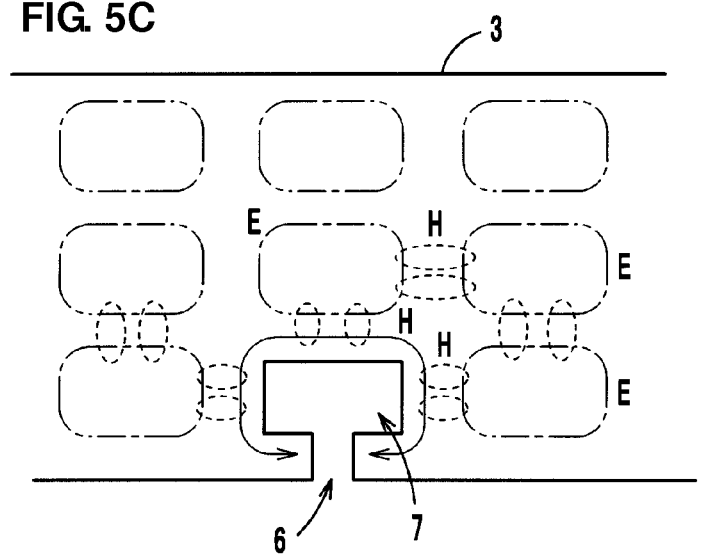

In the radiation plate 3, the distribution of the electromagnetic field is two-dimensionally spread over the radiation plate 3 due to a linkage among the induction of the magnetic fields H by the induced currents I1 and I2, the induction of an electric field E by the magnetic fields H, and the induction of the magnetic fields H by the electric field E, as shown in FIG. 5C. The distribution of the electromagnetic field produces the transmission of the radio signal. Accordingly, it is preferable that the radio signal processed in the wireless IC device 1 be within a high frequency band, and more preferably, within a ultra high frequency (UHF) band.

As described above, the gain of the radio signal transmitted and received on the radiation plate 3 can be controlled by adjusting the length L1 and/or the width L2 of the slit 6. Specifically, the gain tends to increase when the length L1 of the slit 6 is increased and when the width L2 of the slit 6 is decreased.

As shown in FIG. 5A, it is preferable that the main portions of the mounting electrodes 12 provided on the power-supply circuit board 4 be provided in areas other than the inner area of the coil pattern 23, when viewed in plan from the direction of the winding axis of the coil pattern 23. In other words, it is preferable that the mounting electrodes 12 be arranged so as not to impede the production of the ideal magnetic fields H, particularly, so as not to impede the magnetic fields H passing through the opening 7. Furthermore, it is preferable that the main portions of the mounting electrodes 12 be provided within the plane of incidence of the coil pattern 23. Similarly, when viewed in plan from the direction of the winding axis of the coil pattern 23, the main portions of the mounting electrodes 15 toward the radiation plate 3 are preferably provided in areas other than the inner area of the coil pattern 23 and, furthermore, the main portions of the mounting electrodes 15 are preferably provided within the plane of incidence of the coil pattern 23.

As shown in FIG. 4 and FIG. 5A, the substantially annular wiring conductors 23b to 23f provided on the respective dielectric layers preferably include a plurality of line conductors that are parallel or substantially parallel with each other at predetermined intervals. Specifically, in the first preferred embodiment, the substantially annual-shaped wiring conductors 23b to 23f include two line conductors that are parallel or substantially parallel with each other and that connects the pad conductors arranged at both sides. Consequently, the magnetic flux passes between the two line conductors so to spread the excited magnetic fields toward the center of the coil pattern 23, that is, in a direction perpendicular or substantially perpendicular to the winding axis, thus allowing the magnetic flux to be efficiently used. In addition, an increase in the number of the annular conductors that are parallel or substantially parallel with each other has the advantage of decreasing the direct current resistance of the annular conductors. As a result, the gain of the radio signal is improved.

Figure 6:
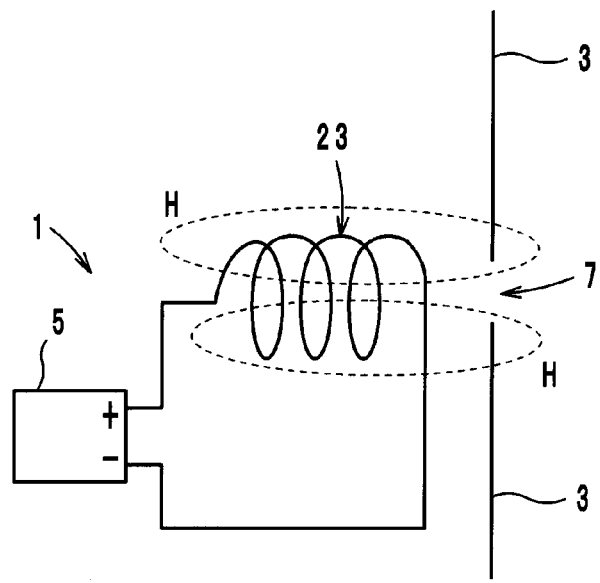
FIG. 6 is an equivalent circuit of the wireless IC device of the first preferred embodiment of the present invention.

As shown in FIG. 6, the wireless IC device 1 of the first preferred embodiment includes a differential-output-type wireless IC chip 5 and is configured such that the coil pattern is connected in series between two input-output electrodes. And, the induced magnetic fields H induced by the coil pattern 23 are propagated to the portion around and through the opening 7 of the radiation plate 3 in an ideal manner.

Although only the coil pattern 23 is shown as the power supply circuit in this equivalent circuit, the stray capacitance produced between the annular electrodes on the respective layers is also used as a capacitance component because the inductance of the coil pattern 23 is used as an inductance component and the coil pattern 23 is defined by the layered annular electrodes, as described above. It is sufficient for the power supply circuit provided in the power-supply circuit board 4 to include at least the coil pattern. If the power supply circuit has a particular resonant frequency, the power supply circuit may preferably further include, for example, a capacitance component and an inductance component arranged to adjust the resonant frequency.

In the first preferred embodiment, the power supply circuit in the power-supply circuit board 4 preferably has a particular resonant frequency and the frequency of the radio signal transmitted and received on the radiation plate 3 preferably substantially corresponds to the resonant frequency. The "substantial correspondence" means that the bandwidth of the resonant frequency of the power supply circuit is substantially the same as the frequency band of the radio signals that are transmitted and received on the radiation plate 3. Since the frequencies of the transmission signal and/or the reception signal are substantially the same as the resonant frequency of the power supply circuit, as described above, it is possible to provide a wireless IC device having stable frequency characteristics that do not depend on the size and/or shape of the radiation plate 3 or the shape, the material, or other characteristics of the support base 2 which supports the radiation plate 3.

Figure 7:
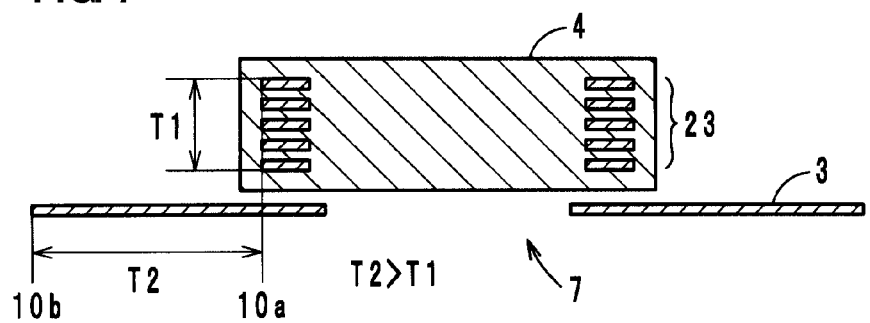
FIG. 7 is a schematic cross-sectional view showing a main portion of the wireless IC device of the first preferred embodiment of the present invention.

In the first preferred embodiment, as shown in FIG. 7, in terms of the area of the periphery of the opening 7 in the radiation plate 3, that is, the area of the portion in which the magnetic flux induced by the coil pattern 23 is received, it is preferable that T2>T1 where T1 denotes the thickness of the coil pattern 23 in the layering direction and T2 denotes the length from a position 10a corresponding to the outer edge of the coil pattern 23 to an outer edge 10b of the radiation plate 3. Establishing such a relationship between the size of the periphery of the opening 7 in the radiation plate 3 and the size of the coil pattern 23 enables the magnetic flux caused by the coil pattern 23 to be received at the side of the radiation plate 3 at a high efficiency of at least about 80%, thus providing a wireless IC device having a reduced loss and greater gain.

Since the power-supply circuit board 4 is coupled to the radiation plate 3 primarily via the magnetic field in the first preferred embodiment, it is not necessary to consider the impedance matching between the power-supply circuit board 4 and the radiation plate 3. In other words, according to the first preferred embodiment, as described above, preferably designing the shape of the slit 6 enables the gain of the radio signal to be very easily controlled.

Second Preferred Embodiment

Figure 8:
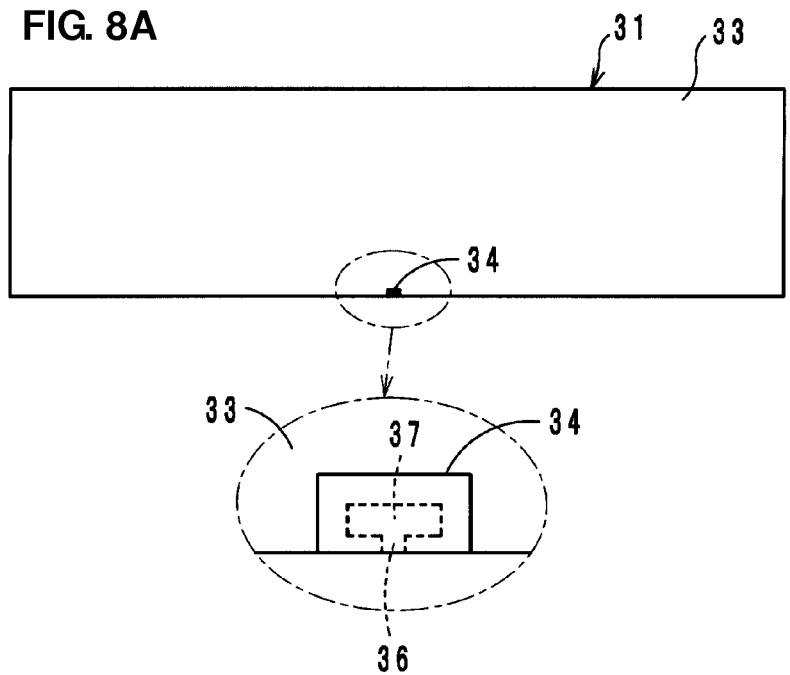

As shown in FIG. 8A, a wireless IC device 31 of a second preferred embodiment of the present invention is similar to the wireless IC device 1 of the first preferred embodiment. The wireless IC device 31 of the second preferred embodiment differs from the wireless IC device 1 of the first preferred embodiment in that a power-supply circuit board 34 is arranged along a side edge of a radiation plate 33. In the wireless IC device 31, the length, refer to as L1 in FIG. 5B, of a slit 36 extending from the side edge of the radiation plate 33 to an opening 37 is decreased and, thus, the gain tends to be decreased. In addition, as shown in FIG. 8B, the width of a slit 36' provided in a radiation plate 33' may be approximately the same as the width of an opening 37'.

Specific numerical values of the gain depending on the numerical value of the length L1 of the slit 36 will now be described when the radiation plate 33 has a length of about 14 cm and a width of about 4 cm.
When L1=about 0 mm, the gain is equal to about −14.4 dB.
When L1=about 0.5 mm, the gain is equal to about −13.1 dB.
When L1=about 1.0 mm, the gain is equal to about −11.6 dB.
When L1=about 1.5 mm, the gain is equal to about −10.9 dB.
When L1=about 2.5 mm, the gain is equal to about −9.4 dB.
When L1=about 4.5 mm, the gain is equal to about −7.9 dB.

Figure 9:
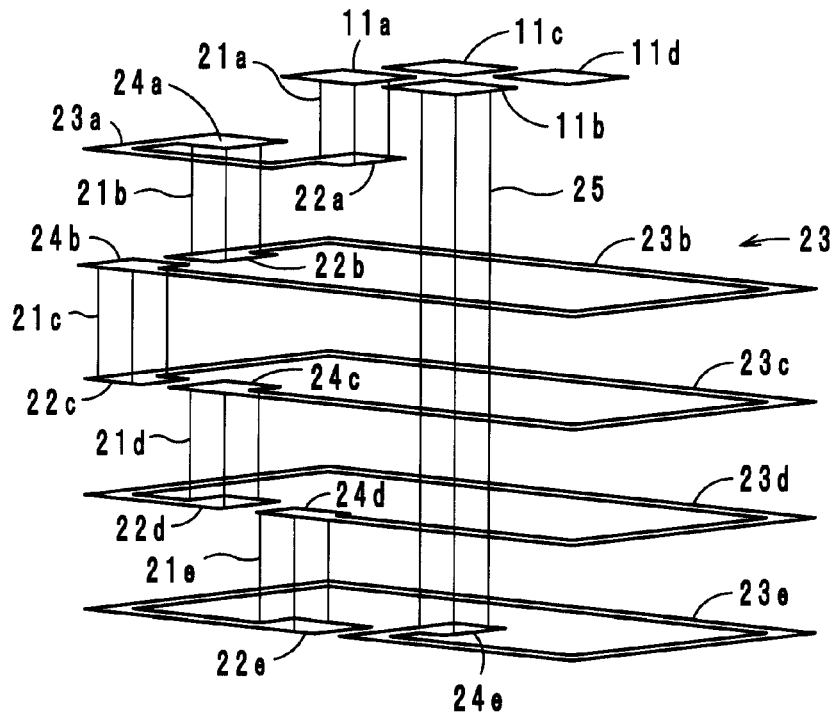
FIG. 9 is a schematic perspective view showing a modification of a coil pattern provided inside the power-supply circuit board.

In the coil pattern 23 provided in the power-supply circuit board 4, the annual conductor provided on each dielectric layer may include one line conductor, as shown in FIG. 9. The coil pattern 23 shown in FIG. 4 includes the wiring conductors 23b to 23f provided on the five layers whereas the coil pattern 23 shown in FIG. 9 includes the coil patterns 23b to 23e provided on the four layers.

When each of the annual conductors (the wiring conductors 23b to 23e) provided on the respective dielectric layers includes one line conductor, as in this modification, the amount of the two-dimensional distribution of the induced magnetic fields caused by the coil pattern 23 is decreased and, thus, the gain tends to be decreased as compared to the configuration shown in FIG. 4. However, the configuration shown in FIG. 9 is simplified and the size of the power-supply circuit board 4 can be reduced.

Third Preferred Embodiment

Figure 10:
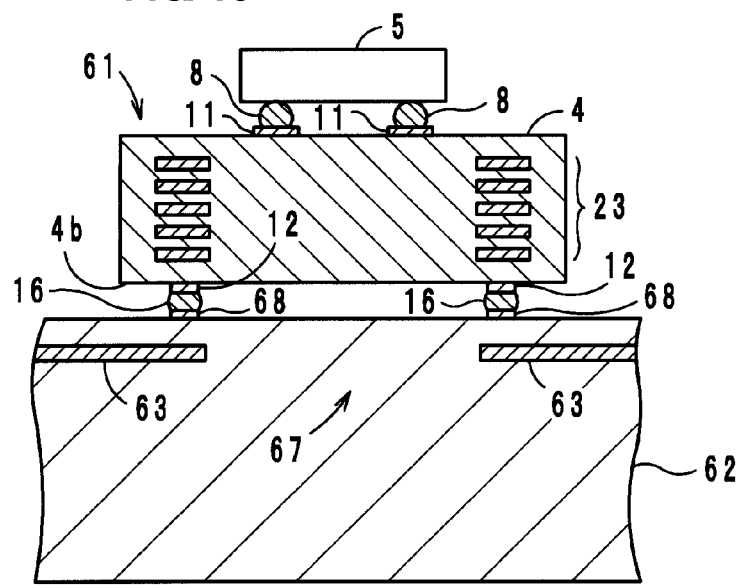
FIG. 10 is a cross-sectional view showing a wireless IC device of a third preferred embodiment of the present invention.

A wireless IC device 61 of a third preferred embodiment of the present invention differs from the wireless IC device 1 of the first preferred embodiment in that a radiation plate 63 is provided inside a support base 62, as shown in FIG. 10. In other words, ground electrodes provided inside the support base 62, for example, a printed circuit board, are used as the radiation plate 63.

Specifically, as shown in FIG. 10, in the wireless IC device 61, the radiation plate 63 including an opening 67 to which a slit (not shown) is connected is provided inside the support base 62. In addition, the power-supply circuit board 4 is mounted on the support base 62. The power-supply circuit board 4 includes a power supply circuit including the coil pattern 23. Furthermore, the wireless IC chip 5 arranged to process a specific radio signal is mounted on the surface of the power-supply circuit board 4.

Mounting electrodes 68 arranged to mount the power-supply circuit board 4 are provided on the surface of the support base 62. The mounting electrodes 68 are connected to the mounting electrodes 12 provided on the other main surface 4b of the power-supply circuit board 4 via the conductive bonds 16, such as solder, for example. In addition, the mounting electrodes 12 on the power supply circuit board 14 are not directly connected to the power supply circuit provided inside the power-supply circuit board 4. Similarly, the mounting electrodes 68 on the support base 62 are not directly connected to the radiation plate 63 provided inside the support base 62.

Fourth Preferred Embodiment

Figure 11:
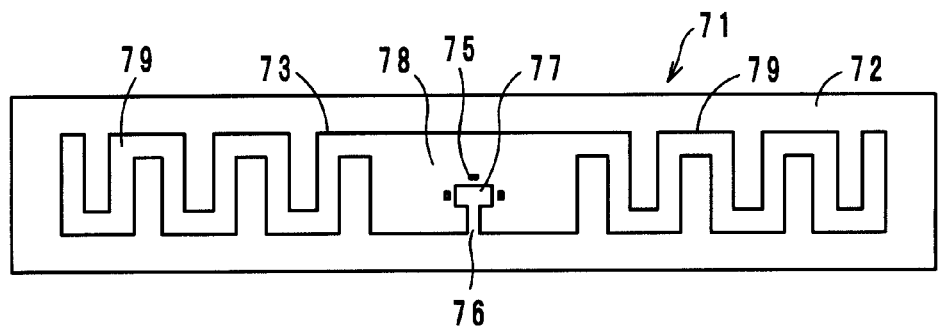
FIG. 11 is a plan view showing a wireless IC device, with the power-supply circuit board omitted, of a fourth preferred embodiment of the present invention.

A wireless IC device 71 of a fourth preferred embodiment of the present invention is a tag-type (inlay-type) wireless IC device, as shown in FIG. 11. Specifically, the wireless IC device 71 includes a radiation plate 73 preferably defined by a flexible metallic film, such as a metallic foil, for example, that is provided on a flexible support 72, such as a polyethylene terephthalate (PET) film, for example. The radiation plate 73 includes a peripheral portion of an opening to which a slit 76 is connected, that is, a substantially planar portion 78 in which the magnetic flux induced by the coil pattern in the power-supply circuit board is received and meandering portions 79 in which a radio signal is primarily transmitted and received. However, no clear boundary is provided between the planar portion 78 in which the magnetic flux is received and the meandering portions 79 in which the radio signal is transmitted and received. As in the wireless IC device 1 of the first preferred embodiment, mounting electrodes 75 via which the power-supply circuit board is mounted are provided around the opening 77 by partially striping a resist material. The wireless IC device 71 can preferably be attached to various commercial products and can be used for management of distribution histories of the commercial products.

As described above, in the wireless IC devices according to preferred embodiments of the present invention, the support which supports the radiation plate may be not only a rigid board, such as a printed circuit board, for example, but may also be a flexible support 72 such as a PET film, for example, as described in the fourth preferred embodiment. Similarly, the radiation plate itself may be not only a rigid plate, such as a sintered metal or a metal plate, for example, but also a flexible plate, such as a metallic foil, for example. In addition, a portion of a metal article, such as a metallic frame of a pair of glasses or a ring, for example, may be used as the radiation plate.

Fifth Preferred Embodiment

Figure 12:
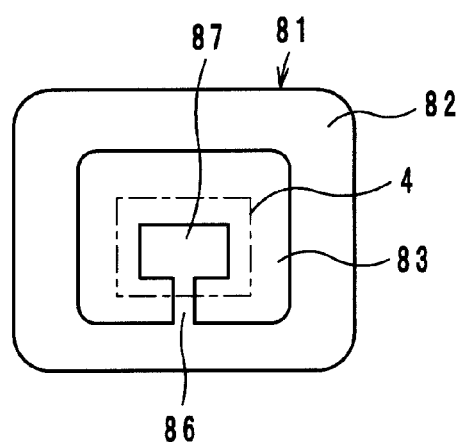
FIG. 12 is a plan view showing a wireless IC device, with the power-supply circuit board omitted, of a fifth preferred embodiment of the present invention.

In a wireless IC device 81 of a fifth preferred embodiment of the present invention, a radiation plate 83 defined by a metallic foil or other suitable material, for example, is provided on a relatively small support 82 defined by a flexible film or other suitable material, as shown in FIG. 12. The wireless IC device 81 preferably has a patch shape, for example. The radiation plate 83 includes an opening 87 and a slit 86 connected to the opening 87.

Figure 13:
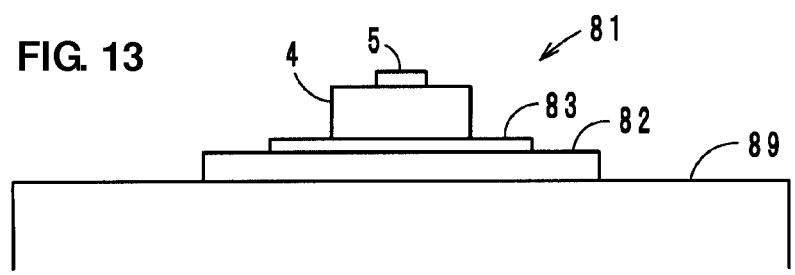
FIG. 13 is a front view showing a state in which the wireless IC device of the fifth preferred embodiment of the present invention is attached to an article.

As shown in FIG. 13, the wireless IC device 81 is preferably used in a state in which the support 82 is adhered on an article 89. If the support 82 has a thickness that allows the magnetic flux to pass therethrough, the article may preferably be made of metal.

Sixth Preferred Embodiment

In a wireless IC device 91 of a sixth preferred embodiment of the present invention, mounting electrodes 12a and 12b connected to the coil pattern 23 via interlayer connection conductors 26a and 26b are provided on the rear surface of the power-supply circuit board 4 and the mounting electrodes 12a and 12b are connected to mounting electrodes 15a and 15b on the radiation plate 3 via the conductive bonds 16, such as solder, for example, as shown in FIGS. 14 and 15. The mounting electrodes 15a and 15b are defined by apertures resulting from partially striping a resist material coated on the surface of the radiation plate 3, as in the mounting electrodes 15 described in the first preferred embodiment. The configuration of the wireless IC device 91 is otherwise substantially the same as that of the first preferred embodiment.

In other words, in the sixth preferred embodiment, not only the coil pattern 23 in the power-supply circuit board 4 is electromagnetically coupled to the radiation plate 3, but also the coil pattern 23 in the power-supply circuit board 4 is directly connected (coupled) to the radiation plate 3. Accordingly, the gain of the radiation plate 3 is increased.

Meanwhile, if a plurality of wireless IC devices that have substantially the same configuration and that each include a relatively large radiation plate are laid over one another, the radiation plates tend to block the magnetic flux. In such a state, the transmission and reception between the wireless IC devices and a reader-writer is disabled. Accordingly, first to fourth modifications of the radiation plate which includes an aperture so that the magnetic flux can pass through the wireless IC devices even if the plurality of wireless IC devices are laid over one another are shown in FIGS. 16 to 19. The arrangements of the apertures shown in the first to fourth modifications in the radiation plates enable the magnetic flux to pass through the aperture even when a plurality of wireless IC devices are laid over one another, thus enabling communication with the reader-writer. In addition, the presence of the annular electrodes increases the area of a portion where the magnetic flux is received on the radiation plate to improve the gain as an antenna.

Figure 16:
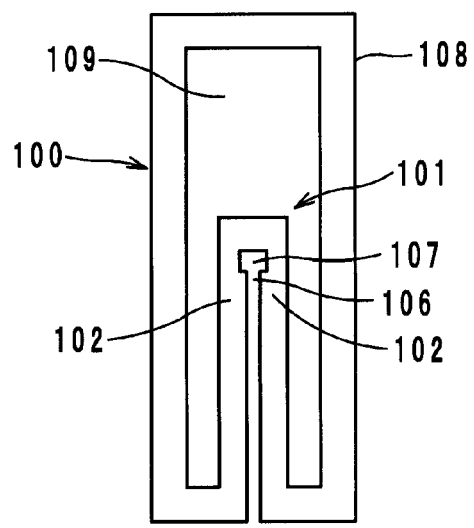
FIG. 16 is a plan view showing a first modification of the radiation plate.

A radiation plate 100 of a first modification, shown in FIG. 16, includes a first electrode 101 including an opening 107 over which the power-supply circuit board 4 is mounted and a slit 106, and an annular second electrode 108 surrounding the first electrode 101. The radiation plate 100 is preferably defined by a metallic foil or other suitable material, for example. The first and second electrodes 101 and 108 are integrally provided on one plane and are electrically connected to each other via a connection portion 102. In the first modification, the magnetic flux passes through an aperture 109 surrounded by the annular second electrode 108. It is preferable that the opening 107 over which the power-supply circuit board 4 is mounted is arranged at a central portion of the annular second electrode 108. This configuration enables the power-supply circuit board 4 to evenly receive the magnetic flux.

Figure 17:
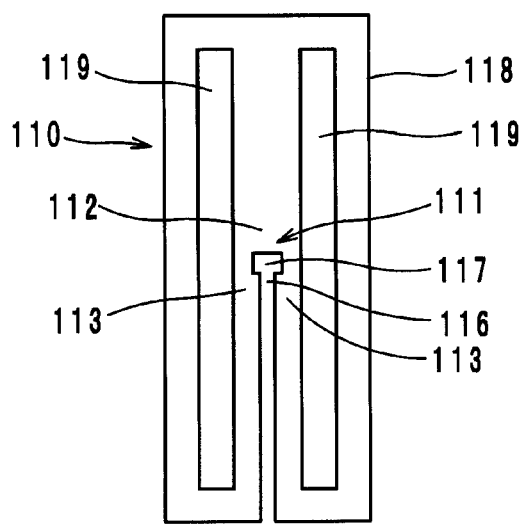
FIG. 17 is a plan view showing a second modification of the radiation plate.

A radiation plate 110 of a second modification, shown in FIG. 17, includes a first electrode 111 including an opening 117 over which the power-supply circuit board 4 is mounted and a slit 116, and an annular second electrode 118 surrounding the first electrode 111. The radiation plate 110 is preferably defined by a metallic foil or other suitable material, for example. The first and second electrodes 111 and 118 are integrally provided on one plane and are electrically connected to each other via connection portions 112 and 113. Since the first electrode 111 is connected to the annular second electrode 118 at two positions, as described above, an electrical signal caused by the magnetic field is efficiency transmitted to the power-supply circuit board 4. In the second modification, the magnetic flux passes through apertures 119 surrounded by the annular second electrode 118.

A radiation plate 120 of a third modification, shown in FIG. 18, includes a first electrode 121 including an opening 127 over which the power-supply circuit board 4 is mounted and a slit 126, and an annular second electrode 128 surrounding the first electrode 121. The first and second electrodes 121 and 128 are integrally provided on one plane and are electrically connected to each other via a connection portion 122. In the third modification, the magnetic flux passes through apertures 129 surrounded by the annular second electrode 128.

In a radiation plate 130 of a fourth modification, shown in FIG. 19, a first electrode 131 is provided separately from a second electrode 138 and the first electrode 131 is adhered on the second electrode 138. Either of a non-conductive adhesive and a conductive adhesive, for example, may preferably be used for the adhesion. In addition, the first electrode 131 may be adhered on the second electrode 138 so that the first electrode 131 opposes the second electrode 138 or so that the film having the first electrode 131 provided on its surface opposes the second electrode 138. The magnetic field is propagated even if the electrode 131 is adhered on the electrode 138. The first electrode 131 includes an opening 137 over which the power-supply circuit board 4 is mounted and a slit 136. The second electrode 138 has the same or substantially the same shape as in the second modification. The magnetic flux passes through apertures 139 surrounded by the second electrode 138. In the fourth modification, making the opening and the slit in the second electrode 138 larger than the opening 137 and the slit 136 in the first electrode 131 enables the opening 137 of a predetermined size and the width of the slit 136 to be ensured in the first electrode 131 even if a slight positional shift occurs in the adhesion of the first electrode 131 on the second electrode 138.

The wireless IC devices according to preferred embodiments of the present invention are not restricted to the preferred embodiments described above and may be varied within the scope of the summary of the present invention.

As described above, preferred embodiments of the present invention are useful for a wireless IC device and, particularly, are excellent in that the gains of transmission and reception signals can be effectively controlled.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A wireless integrated circuit device comprising:
   a wireless integrated circuit arranged to process a radio signal;
   a power-supply circuit connected to the wireless integrated circuit and including a coil pattern; and
   a radiation plate arranged to radiate a transmission signal supplied from the power-supply circuit board or to receive a reception signal to supply the reception signal to the power-supply circuit board; wherein
   the radiation plate includes first and second openings arranged adjacent to one another and provided in a portion thereof and a slit connected to the first opening and, when viewed in plan from a direction of a winding axis of the coil pattern, the first opening in the radiation plate overlaps with at least a portion of an inner area of the coil pattern;
   the first opening is open to an outside of the radiation plate via the slit; and
   the second opening is completely surrounded by portions of the radiation plate so as to be closed to an outside of the radiation plate.

2. The wireless integrated circuit device according to claim 1, wherein, during radiation of the transmission signal, an induced current is excited around the first opening in the radiation plate by a current flowing through the coil pattern and a magnetic field and an electric field caused by the induced current spread over the radiation plate to cause the radiation plate to operate as an electric field antenna.

3. The wireless integrated circuit device according to claim 1, wherein the coil pattern is directly connected to the radiation plate.

4. The wireless integrated circuit device according to claim 1, wherein, when viewed in plan from the direction of the winding axis of the coil pattern, the first opening in the radiation plate substantially entirely overlaps with the inner area of the coil pattern and an area of the first opening is approximately the same as that of the inner area.

5. The wireless integrated circuit device according to claim 1, wherein the wireless integrated circuit is a chip type wireless integrated circuit and is mounted on one main surface of the power-supply circuit board, and the power-supply circuit board is mounted on one of the radiation plate or a support base supporting the radiation plate with another main surface of the power-supply circuit board defining a mounting surface.

6. The wireless integrated circuit device according to claim 5, wherein a mounting electrode that is not directly connected to the power supply circuit is provided on the another main surface of the power-supply circuit board, and the mounting electrode is coupled to a mounting electrode on the radiation plate, which is defined as a portion of the radiation plate via a conductive bond.

7. The wireless integrated circuit device according to claim 6, wherein a main portion of the mounting electrode on the power-supply circuit board is provided in an area other than the inner area of the coil pattern.

8. The wireless integrated circuit device according to claim 1, wherein the power-supply circuit board is defined by a multilayer body including a plurality of layered dielectric layers, and the coil pattern includes a plurality of annular conductors arranged on the plurality of dielectric layers and connected to one another via interlayer conductors in the layered direction of the multilayer body so as to define a helical pattern having the winding axis.

9. The wireless integrated circuit device according to claim 8, wherein each of the plurality of annular conductors provided on the dielectric layers includes a plurality of line conductors that are arranged at predetermined intervals and that are parallel or substantially parallel with each other.

10. The wireless integrated circuit device according to claim 1, wherein the power supply circuit has a resonant frequency and the frequencies of at least one of the transmission signal and the reception signal substantially correspond to the resonant frequency.

11. The wireless integrated circuit device according to claim 1, wherein the radiation plate includes a first electrode including the first opening and the slit and an annular second electrode surrounding the first electrode.

12. The wireless integrated circuit device according to claim 11, wherein the first electrode and the second electrode are integrally provided on one plane.

13. The wireless integrated circuit device according to claim 11, wherein the first electrode is adhered on the second electrode.

14. The wireless integrated circuit device according to claim 11, wherein the radiation plate is made of a metallic material.

* * * * *